United States Patent
Salter et al.

(10) Patent No.: US 9,905,743 B2
(45) Date of Patent: Feb. 27, 2018

(54) PRINTED LED HEAT SINK DOUBLE LOCK

(71) Applicant: Ford Global Technologies, LLC, Dearborn, MI (US)

(72) Inventors: Stuart C. Salter, White Lake, MI (US); Paul Kenneth Dellock, Northville, MI (US); James J. Surman, Clinton Township, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 329 days.

(21) Appl. No.: 14/807,132

(22) Filed: Jul. 23, 2015

(65) Prior Publication Data
US 2015/0333240 A1    Nov. 19, 2015

Related U.S. Application Data

(63) Continuation-in-part of application No. 14/603,636, filed on Jan. 23, 2015, now Pat. No. 9,573,517, which
(Continued)

(51) Int. Cl.
| | |
|---|---|
| *F21V 29/00* | (2015.01) |
| *H01L 33/64* | (2010.01) |
| *H01L 33/08* | (2010.01) |
| *H01L 33/42* | (2010.01) |
| *H01L 33/50* | (2010.01) |
| *H01L 33/54* | (2010.01) |

(Continued)

(52) U.S. Cl.
CPC .......... *H01L 33/642* (2013.01); *H01L 33/005* (2013.01); *H01L 33/08* (2013.01); *H01L 33/42* (2013.01); *H01L 33/50* (2013.01); *H01L 33/54* (2013.01); *H01L 33/62* (2013.01); *H01L 33/641* (2013.01); *H05B 33/0803* (2013.01); *H05B 37/0218* (2013.01); *H05B 37/0227* (2013.01); *H01L 2933/005* (2013.01); *H01L 2933/0016* (2013.01); *H01L 2933/0066* (2013.01); *H01L 2933/0075* (2013.01); *Y02B 20/46* (2013.01)

(58) Field of Classification Search
CPC .......... B60Q 3/80; B60Q 1/0088; B60Q 3/64; B60Q 2400/20
USPC .................................................. 362/543–545
See application file for complete search history.

(56) References Cited

U.S. PATENT DOCUMENTS

| | | |
|---|---|---|
| 2,486,859 A | 11/1949 | Meijer et al. |
| 5,053,930 A | 10/1991 | Benavides |

(Continued)

FOREIGN PATENT DOCUMENTS

| | | |
|---|---|---|
| CN | 101337492 A | 1/2009 |
| CN | 201169230 Y | 2/2009 |

(Continued)

*Primary Examiner* — William Carter
(74) *Attorney, Agent, or Firm* — Vichit Chea; Price Heneveld LLP

(57) ABSTRACT

A light emitting assembly is disclosed. The assembly comprises a heat sink of an electrically conductive material configured to function as a first electrode. A plurality of LEDs in a semiconductor ink is disposed on the first electrode and operable to emit an excitation emission. The assembly further comprises a second electrode in communication with the plurality of LEDs and at least one photoluminescent layer proximate at least one of the electrodes. The photoluminescent layer is configured to convert the excitation emission to an output emission.

19 Claims, 5 Drawing Sheets

Related U.S. Application Data is a continuation-in-part of application No. 14/086,442, filed on Nov. 21, 2013.

(51) Int. Cl.
*H01L 33/62* (2010.01)
*H01L 33/00* (2010.01)
*H05B 37/02* (2006.01)
*H05B 33/08* (2006.01)

(56) References Cited

U.S. PATENT DOCUMENTS

| | | | |
|---|---|---|---|
| 5,709,453 A | 1/1998 | Krent et al. |
| 5,839,718 A | 11/1998 | Hase et al. |
| 6,031,511 A | 2/2000 | DeLuca et al. |
| 6,117,362 A | 9/2000 | Yen et al. |
| 6,419,854 B1 | 7/2002 | Yocom et al. |
| 6,494,490 B1 | 12/2002 | Trantoul |
| 6,577,073 B2 | 6/2003 | Shimizu et al. |
| 6,729,738 B2 | 5/2004 | Fuwausa et al. |
| 6,737,964 B2 | 5/2004 | Samman et al. |
| 6,773,129 B2 | 8/2004 | Anderson, Jr. et al. |
| 6,820,888 B1 | 11/2004 | Griffin |
| 6,851,840 B2 | 2/2005 | Ramamurthy et al. |
| 6,859,148 B2 | 2/2005 | Miller |
| 6,871,986 B2 | 3/2005 | Yamanaka et al. |
| 6,953,536 B2 | 10/2005 | Yen et al. |
| 6,990,922 B2 | 1/2006 | Ichikawa et al. |
| 7,015,893 B2 | 3/2006 | Li et al. |
| 7,161,472 B2 | 1/2007 | Strumolo et al. |
| 7,213,923 B2 | 5/2007 | Liu et al. |
| 7,216,997 B2 | 5/2007 | Anderson, Jr. |
| 7,249,869 B2 | 7/2007 | Takahashi et al. |
| 7,264,366 B2 | 9/2007 | Hulse |
| 7,264,367 B2 | 9/2007 | Hulse |
| 7,441,914 B2 | 10/2008 | Palmer et al. |
| 7,501,749 B2 | 3/2009 | Takeda et al. |
| 7,575,349 B2 | 8/2009 | Bucher et al. |
| 7,635,212 B2 | 12/2009 | Seidler |
| 7,726,856 B2 | 6/2010 | Tsutsumi |
| 7,745,818 B2 | 6/2010 | Sofue et al. |
| 7,753,541 B2 | 7/2010 | Chen et al. |
| 7,834,548 B2 | 11/2010 | Jousse et al. |
| 7,862,220 B2 | 1/2011 | Cannon et al. |
| 7,987,030 B2 | 7/2011 | Flores et al. |
| 8,016,465 B2 | 9/2011 | Egerer et al. |
| 8,022,818 B2 | 9/2011 | Ia Tendresse et al. |
| 8,044,415 B2 | 10/2011 | Messere et al. |
| 8,066,416 B2 | 11/2011 | Bucher |
| 8,071,988 B2 | 12/2011 | Lee et al. |
| 8,097,843 B2 | 1/2012 | Agrawal et al. |
| 8,120,236 B2 | 2/2012 | Auday et al. |
| 8,136,425 B2 | 3/2012 | Bostick |
| 8,163,201 B2 | 4/2012 | Agrawal et al. |
| 8,178,852 B2 | 5/2012 | Kingsley et al. |
| 8,197,105 B2 | 6/2012 | Yang |
| 8,203,260 B2 | 6/2012 | Li et al. |
| 8,207,511 B2 | 6/2012 | Bortz et al. |
| 8,232,533 B2 | 7/2012 | Kingsley et al. |
| 8,247,761 B1 | 8/2012 | Agrawal et al. |
| 8,286,378 B2 | 10/2012 | Martin et al. |
| 8,408,766 B2 | 4/2013 | Wilson et al. |
| 8,415,642 B2 | 4/2013 | Kingsley et al. |
| 8,421,811 B2 | 4/2013 | Odland et al. |
| 8,466,438 B2 | 6/2013 | Lambert et al. |
| 8,519,359 B2 | 8/2013 | Kingsley et al. |
| 8,519,362 B2 | 8/2013 | Labrot et al. |
| 8,552,848 B2 | 10/2013 | Rao et al. |
| 8,606,430 B2 | 12/2013 | Seder et al. |
| 8,624,716 B2 | 1/2014 | Englander |
| 8,631,598 B2 | 1/2014 | Li et al. |
| 8,664,624 B2 | 3/2014 | Kingsley et al. |
| 8,683,722 B1 | 4/2014 | Cowan |
| 8,724,054 B2 | 5/2014 | Jones |
| 8,754,426 B2* | 6/2014 | Marx | F21K 9/00 257/88 |
| 8,773,012 B2 | 7/2014 | Ryu et al. |
| 8,809,126 B2 | 8/2014 | Lowenthal et al. |
| 8,846,184 B2 | 9/2014 | Agrawal et al. |
| 8,851,694 B2 | 10/2014 | Harada |
| 8,876,352 B2 | 11/2014 | Robbins et al. |
| 8,877,101 B2 | 11/2014 | Lowenthal et al. |
| 8,952,341 B2 | 2/2015 | Kingsley et al. |
| 8,994,495 B2 | 3/2015 | Dassanayake et al. |
| 9,006,751 B2 | 4/2015 | Kleo et al. |
| 9,018,833 B2 | 4/2015 | Lowenthal et al. |
| 9,057,021 B2 | 6/2015 | Kingsley et al. |
| 9,065,447 B2 | 6/2015 | Buttolo et al. |
| 9,187,034 B2 | 11/2015 | Tarahomi et al. |
| 9,299,887 B2 | 3/2016 | Lowenthal et al. |
| 2002/0159741 A1 | 10/2002 | Graves et al. |
| 2002/0163792 A1 | 11/2002 | Formoso |
| 2003/0167668 A1 | 9/2003 | Fuks et al. |
| 2003/0179548 A1 | 9/2003 | Becker et al. |
| 2004/0213088 A1 | 10/2004 | Fuwausa |
| 2005/0084229 A1 | 4/2005 | Babbitt et al. |
| 2006/0087826 A1 | 4/2006 | Anderson, Jr. |
| 2006/0097121 A1 | 5/2006 | Fugate |
| 2007/0032319 A1 | 2/2007 | Tufte |
| 2007/0285938 A1 | 12/2007 | Palmer et al. |
| 2007/0297045 A1 | 12/2007 | Sakai et al. |
| 2009/0217970 A1 | 9/2009 | Zimmerman et al. |
| 2009/0219730 A1 | 9/2009 | Syfert et al. |
| 2009/0251920 A1 | 10/2009 | Kino et al. |
| 2009/0260562 A1 | 10/2009 | Folstad et al. |
| 2009/0262515 A1 | 10/2009 | Lee et al. |
| 2010/0102736 A1 | 4/2010 | Hessling |
| 2011/0012062 A1 | 1/2011 | Agrawal et al. |
| 2012/0001406 A1 | 1/2012 | Paxton et al. |
| 2012/0104954 A1 | 5/2012 | Huang |
| 2012/0183677 A1 | 7/2012 | Agrawal et al. |
| 2012/0280528 A1 | 11/2012 | Dellock et al. |
| 2013/0092965 A1 | 4/2013 | Kijima et al. |
| 2013/0176750 A1 | 7/2013 | Ray et al. |
| 2013/0335994 A1 | 12/2013 | Mulder et al. |
| 2014/0003044 A1 | 1/2014 | Harbers et al. |
| 2014/0029281 A1 | 1/2014 | Suckling et al. |
| 2014/0065442 A1 | 3/2014 | Kingsley et al. |
| 2014/0103258 A1 | 4/2014 | Agrawal et al. |
| 2014/0117387 A1* | 5/2014 | Ray | H01L 33/501 257/88 |
| 2014/0211498 A1 | 7/2014 | Cannon et al. |
| 2014/0264396 A1 | 9/2014 | Lowenthal et al. |
| 2014/0266666 A1 | 9/2014 | Habibi |
| 2014/0373898 A1 | 12/2014 | Rogers et al. |
| 2015/0046027 A1 | 2/2015 | Sura et al. |
| 2015/0109602 A1 | 4/2015 | Martin et al. |
| 2015/0138789 A1 | 5/2015 | Singer et al. |
| 2015/0267881 A1 | 9/2015 | Salter et al. |
| 2016/0016506 A1 | 1/2016 | Collins et al. |
| 2016/0102819 A1 | 4/2016 | Misawa et al. |
| 2016/0236613 A1 | 8/2016 | Trier |
| 2017/0158125 A1 | 6/2017 | Schuett et al. |

FOREIGN PATENT DOCUMENTS

| | | |
|---|---|---|
| CN | 201193011 Y | 2/2009 |
| CN | 204127823 U | 1/2015 |
| DE | 4120677 A1 | 1/1992 |
| DE | 29708699 U1 | 7/1997 |
| DE | 10319396 A1 | 11/2004 |
| EP | 1793261 A1 | 6/2007 |
| EP | 2778209 A1 | 9/2014 |
| JP | 2000159011 A | 6/2000 |
| JP | 2007238063 A | 9/2007 |
| KR | 20060026531 A | 3/2006 |
| WO | 2006047306 A1 | 5/2006 |
| WO | 2012031178 A2 | 3/2012 |
| WO | 2014068440 A1 | 5/2014 |
| WO | 2014161927 A1 | 10/2014 |

\* cited by examiner

PRINTED LED HEAT SINK DOUBLE LOCK

CROSS-REFERENCE TO RELATED APPLICATIONS

This application is a continuation-in-part of U.S. patent application Ser. No. 14/603,636, filed Jan. 23, 2015, and entitled "DOOR ILLUMINATION AND WARNING SYSTEM," now U.S. Pat. No. 9,573,517 which is a continuation-in-part of U.S. patent application Ser. No. 14/086,442, filed Nov. 21, 2013, and entitled "VEHICLE LIGHTING SYSTEM WITH PHOTOLUMINESCENT STRUCTURE." The aforementioned related applications are hereby incorporated by reference in their entirety.

FIELD OF THE INVENTION

The present disclosure generally relates to vehicle lighting systems, and more particularly, to vehicle lighting systems having thin profiles that may be operable to conform to flexible materials and/or surfaces.

BACKGROUND OF THE INVENTION

Lighting in vehicles traditionally has been applied to provide illumination for reading, vehicle entry, and operation. However, lighting may also be applied to improve vehicle features and systems to ensure that vehicle passengers, operators, and onlookers have an improved experience. Such improvements may arise from improvements in safety, visibility, aesthetics, and/or features. The disclosure provides for a lighting system that may be operable to illuminate a portion of a vehicle. In some embodiments, the disclosure may provide for a lighting apparatus operable to emit a high intensity emission of light having at least one heat-dispersing electrode forming a base layer.

SUMMARY OF THE INVENTION

According to one aspect of the present disclosure, a light emitting assembly is disclosed. The assembly comprises a heat sink of an electrically conductive material configured to function as a first electrode. A plurality of LEDs in a semiconductor ink is disposed on the first electrode and operable to emit an excitation emission. The assembly further comprises a second electrode in communication with the plurality of LEDs and at least one photoluminescent layer proximate at least one of the electrodes. The photoluminescent layer is configured to convert the excitation emission to an output emission.

According to another aspect of the present disclosure, a light emitting assembly is disclosed. The assembly comprises a heat sink of an electrically conductive material configured to function as a first electrode. A plurality of LEDs in a semiconductor ink is disposed on the first electrode and operable to output an emission of light. A second electrode is in communication with the plurality of LEDs. The heat sink is configured to conduct heat away from the plurality of LEDs during a high intensity output of the emission.

According to yet another aspect of the present disclosure, a method of manufacturing a lighting apparatus for a vehicle is disclosed. The method comprises printing a light producing layer in a semi-conductor ink on a first electrode configured to disperse heat energy. A top transparent layer is printed on the light producing layer to form a second electrode. A first protective layer is thermal-formed over at least a portion of the light producing layer and the second electrode to create a first seal. The first seal is configured to protect the light producing layer to form a first sealed assembly. The first sealed assembly comprises the first electrode, the light producing layer, and the second electrode. The first sealed assembly is stamped to form a locking interconnection in a stamped portion between the first electrode and the first seal.

These and other aspects, objects, and features of the present disclosure will be understood and appreciated by those skilled in the art upon studying the following specification, claims, and appended drawings.

DETAILED DESCRIPTION OF THE PREFERRED EMBODIMENTS

As required, detailed embodiments of the present disclosure are disclosed herein. However, it is to be understood that the disclosed embodiments are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

Figure 1A:
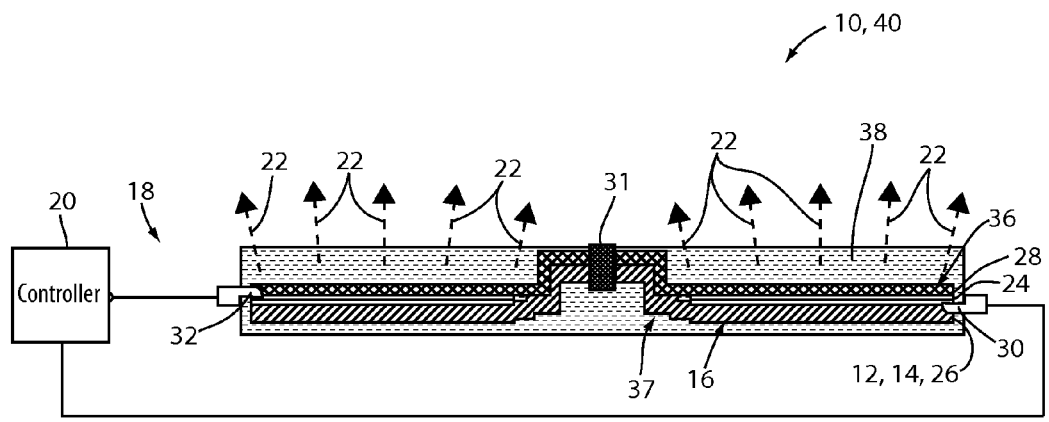
FIG. 1A is a side cross-sectional schematic view of an illumination apparatus comprising a heat-dispersing electrode.
Figure 1B:
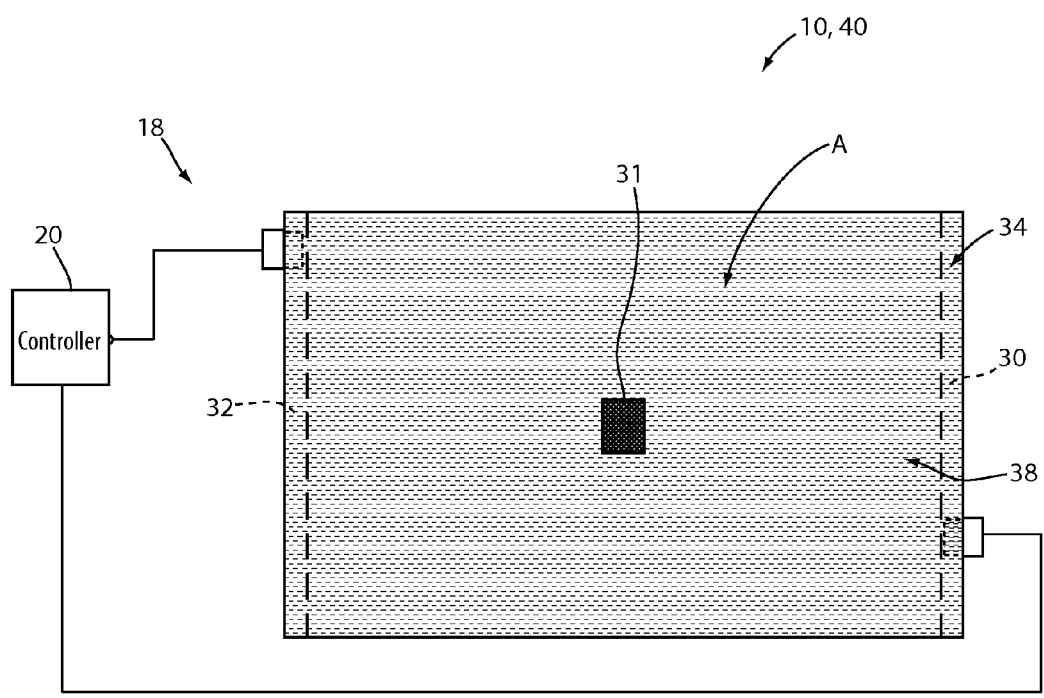
FIG. 1B is a top schematic view of an illumination apparatus comprising a heat-dispersing electrode.

Referring to FIGS. 1A and 1B, the disclosure describes an illumination apparatus 10. The illumination apparatus 10 may be configured to illuminate a portion of a vehicle and in some embodiments may be configured to illuminate at least one running light, headlight, and/or break light. FIG. 1A illustrates a side schematic view of the illumination apparatus 10 demonstrating at least one heat-dispersing electrode 12 forming a base layer 14. The heat-dispersing electrode 12 may correspond to an integral heat sink 16. The heat sink 16 may be configured to transmit heat away from a plurality of light emitting diode (LED) light sources to an environment 18 proximate the illumination apparatus 10. In this way, the LED light sources may be controlled by a controller 20 to emit a high intensity output emission 22 while preserving the longevity of the LED light sources.

FIGS. 1A and 1B demonstrate a side schematic view and a top schematic view of the illumination apparatus, respectively. The LED sources may be disposed in a light producing layer 24 printed on the heat-dispersing electrode 12. In this configuration, the heat-dispersing electrode 12 may correspond to a first electrode 26 configured to form a circuit with a second electrode 28 such that the controller 20 may selectively activate the LED light sources. The first electrode 26 may be in communication with the controller 20 via a first terminal connection, which may correspond to a first bus bar 30. The second electrode 28 may be in communication with a second terminal connection, which may be in communication with the second electrode via a second bus bar 32 of the illumination apparatus 10. The first bus bar 30 and the second bus bar 32 may each be disposed along a portion of a perimeter 34 of the illumination apparatus 10. The second electrode 28 is shown as a portion of the light producing layer 24 in FIG. 1A. Further discussion of the light producing layer 24 and other elements of the light producing assembly are discussed in reference to FIGS. 2 and 3.

The first bus bar 30 may be disposed substantially along a first portion of the perimeter 34. The second bus bar 32 may be disposed substantially along a second portion of the perimeter 34. The first portion corresponding to the first bus bar 30 and the second portion corresponding to the second bus bar 32 may be disposed on opposing side of the perimeter 34 and/or substantially spaced from each other along the perimeter 34. Though the bus bars 32 and 34 are discussed in this particular embodiment as being separately located along the perimeter 34, in some embodiments, a terminal connector may be centrally disposed in the illumination apparatus 10 and correspond to a crimped connector 31.

In some implementations, the crimped connector 31 may correspond to a plurality of terminal connections, each in communication with a power supply via the controller 20. In this configuration, the plurality of terminal connections may be distributed substantially evenly across a surface area A of the illumination apparatus 10. The terminal connections may be conductively connected to the first electrode 26 and formed by a stamping process that may correspond to the stamping process discussed in reference to FIGS. 4A and 4B. Additionally, the second bus bar 32 may extend substantially along the perimeter 34. In this configuration, the plurality of terminal connections (e.g. the crimped connector 31) may supply current to the heat-dispersing electrode 12 substantially uniformly across the surface area A and outward to the second bus bar 32.

The illumination apparatus 10 may further comprise at least one protective layer, for example the first protective layer 36, which may be molded, thermal formed, or otherwise applied to the light producing layer 24. During a manufacturing method that may be utilized to produce the illumination apparatus 10, each of the first electrode 26, the light producing layer 24, the second electrode 28, and the first protective layer 36 may be stamped together forming a locking interconnection having a locking profile 37. In this configuration, each of the first electrode 26, the light producing layer 24, the second electrode 28, and the first protective layer 36 may be combined as integral layers of the illumination apparatus 10.

The illumination apparatus 10 may further comprise a second protective layer 38 corresponding to the at least one protective layer. The second protective layer 38 may correspond to an over-molded polymeric material configured to substantially seal the illumination apparatus forming an enclosed or sealed assembly 40. The second protective layer 38 may correspond to a substantially light transmissive or transparent polymeric material molded over the illumination apparatus. The transparent polymeric material may correspond to a thermally conductive polymer, such as a thermally conductive injection molding grade thermoplastic. In this configuration, the light producing layer 24 is protected in a sealed configuration and the heat-dispersing electrode 12 may provide for the LED light sources of the light producing layer 24 to disperse heat for efficient operation when implemented in the sealed assembly.

As discussed previously, in an exemplary embodiment, the illumination apparatus 10 may be in communication with the controller 20. The controller 20 may further be in communication with various control modules and systems of the vehicle. In this configuration, the controller 20 may selectively illuminate the illumination apparatus 10 to correspond to one or more states of the vehicle. A state of the vehicle may correspond to at least one of a locked/unlocked condition, a lighting condition, a driving condition, a drive gear selection, a door ajar condition, or any other condition that may be sensed by various control modules and systems of the vehicle. The various configurations of the illumination apparatus may provide for beneficial lighting configured to illuminate at least a portion of the vehicle.

Figure 2:
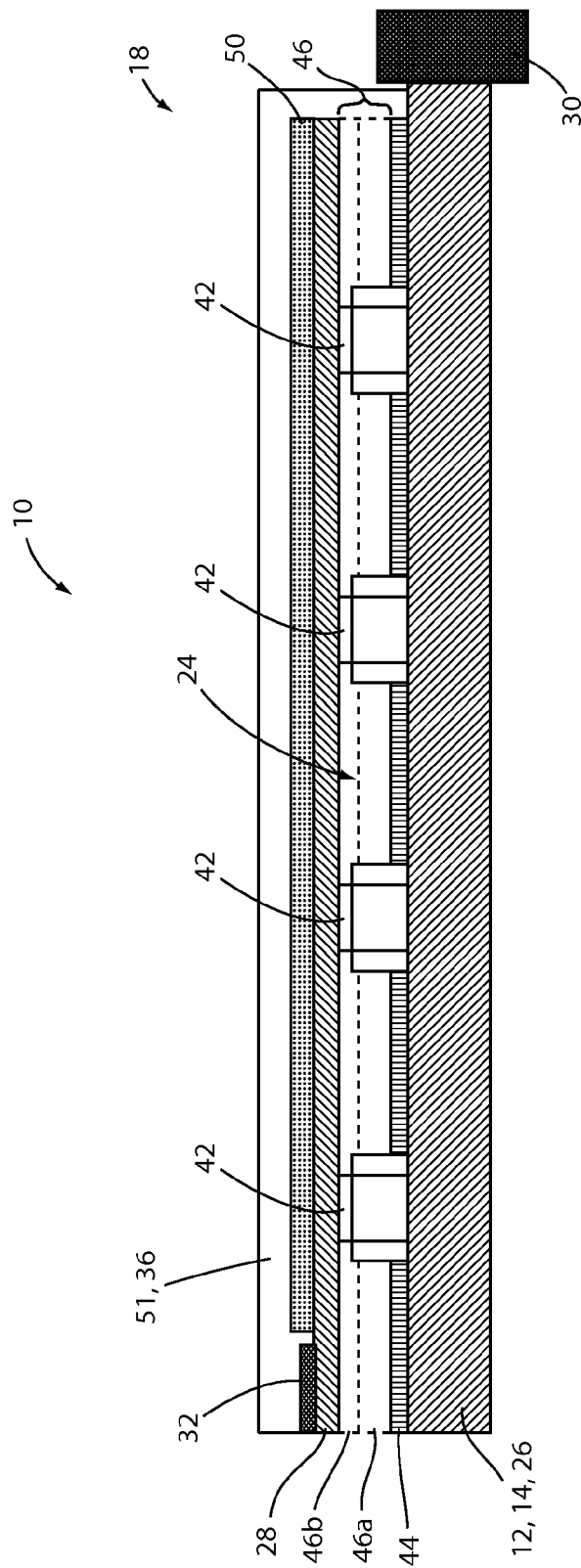
FIG. 2 is a side cross-sectional view of an illumination apparatus configured to selectively illuminate an interior cavity of a storage compartment.

Referring to FIG. 2, the illumination apparatus 10 may correspond to a substantially thin, printed LED assembly. The illumination apparatus comprises the heat-dispersing electrode 12 forming the base layer 14. The heat-dispersing electrode 12 may correspond to the integral heat sink 16 configured to transmit heat away from the plurality of LED light sources 42 to an environment 18 proximate the illumination apparatus 10. In this way, the LED light sources 42 may be controlled by the controller 20 to emit a high intensity output emission 22 while preserving the longevity of the LED light sources 42.

The controller 20 may be in communication with the heat-dispersing electrode via the first bus bar 30, which may extend along the first portion of the perimeter 34 of the illumination apparatus 10. The bus bars 30 and 32 conductive connections and/or conduits discussed herein may be of metallic and/or conductive materials. The conductive materials may be printed or otherwise affixed to the electrodes (e.g. the first electrode 26 and the second electrode 28) or conductive layers. The bus bars 30 and 32 may be utilized in the illumination apparatus 10 to conductively connect a plurality of LED sources 42 to a power source via the controller 20. In this way, the first bus bar 30, the second bus bar 32, and other connections in the light producing assembly, may be configured to uniformly deliver current along and/or across a surface of the illumination apparatus 10.

The LED sources 42 may be disposed in the light producing layer 24 printed on the heat-dispersing electrode 12. In this configuration, the heat-dispersing electrode 12 may correspond to a first electrode 26 configured to form a circuit with the second electrode 28 such that the controller 20 may selectively activate the LED light sources 42. In order to accommodate for the heat energy to be transmitted away from the LED light sources, the heat-dispersing electrode 12 may be approximately 0.05 mm to 1 mm in thickness. In some embodiments, the heat-dispersing electrode 12 may be approximately 0.07 mm to 0.25 mm thick. In an exemplary embodiment, the heat-dispersing electrode 12 may be approximately 0.08 mm to 1.2 mm in thickness. For example, the heat-dispersing electrode 12 may be of aluminum or an alloy thereof having a thickness of approximately 0.1 mm.

The LED sources 42 may be printed, dispersed or otherwise applied to the heat-dispersing electrode 12 (e.g. the first electrode 26) via a semiconductor ink 44. The semiconductor ink may correspond to a liquid suspension comprising a concentration of LED sources 42 dispersed therein. The concentration of the LED sources may vary based on a desired emission intensity of the illumination apparatus 10. The LED sources 42 may be dispersed in a random or controlled fashion within the semiconductor ink 44. The LED sources 42 may correspond to micro-LEDs of gallium nitride elements, which may be approximately 5 microns to 400 microns across a width substantially aligned with the surface of the first electrode. The semiconductor ink 44 may include various binding and dielectric materials including but not limited to one or more of gallium, indium, silicon carbide, phosphorous and/or translucent polymeric binders. In this configuration, the semiconductor ink 44 may contain various concentrations of LED sources 42 such that a surface density of the LED sources 42 may be adjusted for various applications.

In some embodiments, the LED sources 42 and semiconductor ink 44 may be sourced from Nth Degree Technologies Worldwide Inc. The semiconductor ink 44 can be applied through various printing processes, including ink jet and silk screen processes to selected portion(s) of the heat-dispersing electrode 12. More specifically, it is envisioned that the LED sources 42 are dispersed within the semiconductor ink 44, and shaped and sized such that a substantial quantity of them preferentially align with the first electrode 26 and a second electrode 28 during deposition of the semiconductor ink 44. The portion of the LED sources 42 that ultimately are electrically connected to the electrodes 26 and 28 may be illuminated by a voltage source applied across the first electrode 26 and the second electrode 28. In some embodiments, a power source operating at 12 to 16 VDC from a vehicular power source may be employed as a power source to supply current to the LED sources 42. Additional information regarding the construction of a light producing assembly similar to the illumination apparatus 10 is disclosed in U.S. Pat. No. 9,299,887 to Lowenthal et al., entitled "ULTRA-THIN PRINTED LED LAYER REMOVED FROM SUBSTRATE," filed Mar. 12, 2014, the entire disclosure of which is incorporated herein by reference.

At least one dielectric layer 46 may be printed over the LED sources 42 to encapsulate and/or secure the LED sources 42 in position. The at least one dielectric layer 46 may correspond to a first dielectric layer 46a and a second dielectric layer 46b, which may be of a substantially transparent material. The second electrode 28 may correspond to a top transparent conductor layer printed over the dielectric layer 46 to electrically connect the electrodes 26 and 28. The second electrode 28 may be conductively connected to a second bus bar 32. The bus bars 30 and 32 may be utilized in the illumination apparatus 10 to conductively connect a plurality of light-emitting diode (LED) sources 42 to the power source via the controller 20. Though the plurality of LED are discussed in connected to the controller 20 via the bus bars 30 and 32, in some embodiments, the controller 20 may supply current to the LED sources 42 via various forms of conductive leads or traces configured to conductively connect the controller 20 to the first electrode 26 and the second electrode 28.

The second electrode 28 may be of a conductive epoxy, such as a silver-containing or copper-containing epoxy. The second electrode 28 may be conductively connected to the second bus bar 30. In some embodiments, the first electrode 26 and the second electrode 28 may correspond to an anode electrode and a cathode electrode, respectively. In this configuration a directional flow of current through the LED light sources 42 is established. Points of connection between the bus bars 30 and 32 and the power source may be connected proximate the perimeter 34 of the illumination apparatus and the perimeter, respectively to provide for uniform current distribution among the plurality of LED light sources 42.

Still referring to FIG. 2, in some embodiments, a photoluminescent layer 50 may be applied to the second electrode 28 to form a backlit configuration of the illumination apparatus 10. In some embodiments, the photoluminescent layer may alternatively or additionally be configured in a front-lit configuration. The photoluminescent layer 50 may be applied as a coating, layer, film, and/or photoluminescent substrate to the second electrode or any surface of the illumination apparatus 10 configured to emit the output emission 22 therethrough.

In various implementations, the LED sources 42 may be configured to emit an excitation emission comprising a first wavelength corresponding to blue light. The LED sources 42 may be configured to emit the excitation emission into the photoluminescent layer 50 such that the photoluminescent material becomes excited. In response to the receipt of the excitation emission, the photoluminescent material converts the excitation emission from the first wavelength to an output emission 22 comprising at least a second wavelength longer than the first wavelength. Additionally, one or more coatings 51 or sealing layers (the first protective layer 36) may be applied to an exterior surface of the illumination apparatus 10 to protect the photoluminescent layer 50 and various other portions of the illumination apparatus 10 from damage and wear.

Figure 3:
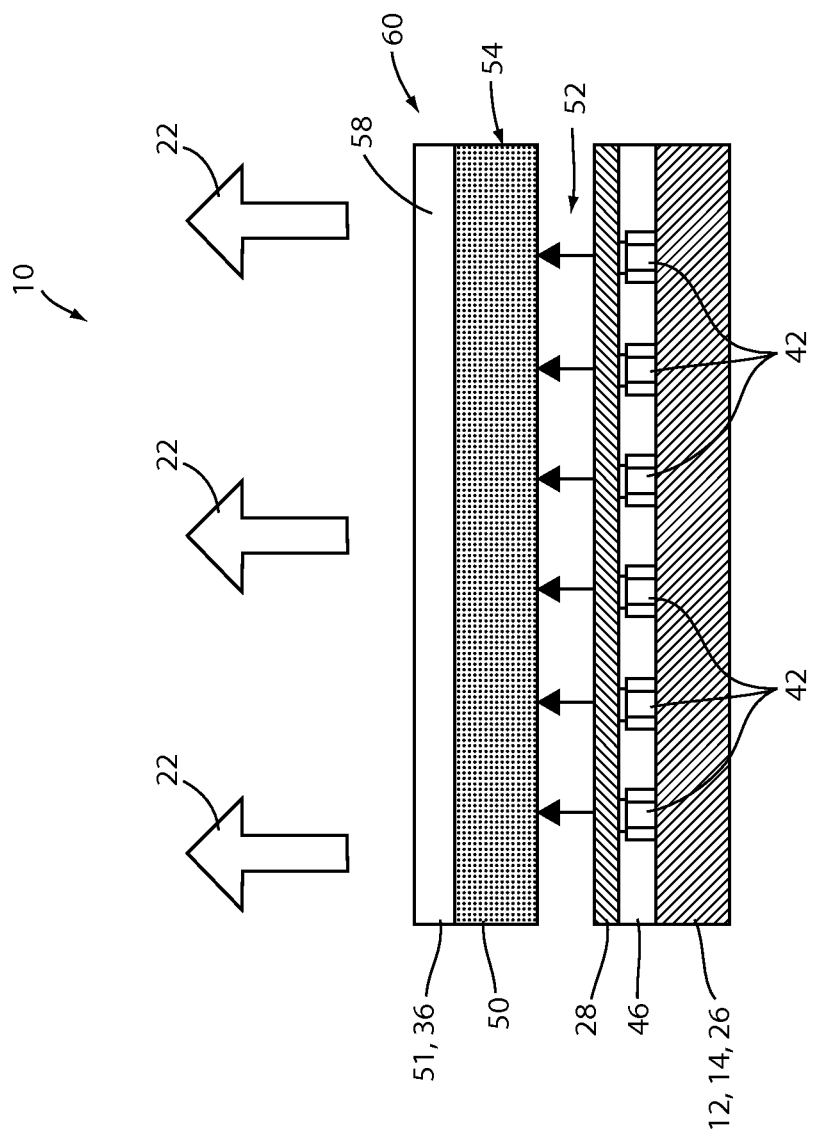
FIG. 3 is a detailed side view of a light producing assembly comprising a photoluminescent layer.

Referring now to FIG. 3, a detailed view of photoluminescent layer 50 of the illumination apparatus 10 in a backlit configuration is shown. The illumination apparatus 10 is configured similar to the illumination apparatus 10 demonstrated in FIG. 2, with like-numbered elements having the same or comparable function and structure. Though not shown in FIG. 3, the LED sources 42 are in electrical communication with the electrodes 26 and 28 and a power source via the controller 20 such that an excitation emission may be output from LED sources 42.

In an exemplary implementation, the excitation emission 52 may correspond to an excitation emission having a first wavelength corresponding to a blue, violet, and/or ultraviolet spectral color range. The blue spectral color range comprises a range of wavelengths generally expressed as blue light (~440-500 nm). In some implementations, the first wavelength $\lambda_1$ may comprise a wavelength in the ultraviolet and near ultraviolet color range (~100-450 nm). In an exemplary implementation, the first wavelength may be approximately equal to 470 nm. Though particular wavelengths and ranges of wavelengths are discussed in reference to the first wavelength, the first wavelength may generally be configured to excite any photoluminescent material.

In operation, the excitation emission 52 is transmitted into an at least partially light transmissive material of the photoluminescent layer 50. The excitation emission 52 is emitted from the LED sources 42 and may be configured such that the first wavelength corresponds to at least one absorption wavelength of one or more photoluminescent materials disposed in the photoluminescent layer 50. For example, the photoluminescent layer 50 may comprise an energy conversion layer 54 configured to convert the excitation emission 52 at the first wavelength to an output emission 22 having a second wavelength, different from the first wavelength. The output emission 22 may comprise one or more wavelengths, one of which may be longer than the first wavelength. The conversion of the excitation emission 52 to the output emission 22 by the energy conversion layer 54 is referred to as a Stokes shift.

In some embodiments, the output emission 22 may correspond to a plurality of wavelengths. Each of the plurality of wavelengths may correspond to significantly different spectral color ranges. For example, the at least second wavelength of the output emission 22 may correspond to a plurality of wavelengths (e.g. second, third, etc.). In some implementations, the plurality of wavelengths may be combined in the output emission 22 to appear as substantially white light. The plurality of wavelengths may be generated by a red-emitting photoluminescent material having a wavelength of approximately 620-750 nm, a green emitting photoluminescent material having a wavelength of approximately 526-606 nm, and a blue or blue green emitting photoluminescent material having a wavelength longer than the first wavelength $\lambda_1$ and approximately 430-525 nm.

In some implementations, a blue or blue green wavelength may correspond to the excitation emission being combined with the output emission 22. As discussed herein, a concentration of the photoluminescent material may be configured to allow at least a portion of the excitation emission to be emitted with the output emission 22 to add a blue hue to the output emission 22. The plurality of wavelengths may be utilized to generate a wide variety of colors of light from the each of the photoluminescent portions converted from the first wavelength. Though the particular colors of red, green, and blue are referred to herein, various photoluminescent materials may be utilized to generate a wide variety of colors and combinations to control the appearance of the output emission 22.

The photoluminescent materials, corresponding to the photoluminescent layer 50 or the energy conversion layer 54, may comprise organic or inorganic fluorescent dyes configured to convert the excitation emission 52 to the output emission 22. For example, the photoluminescent layer 50 may comprise a photoluminescent structure of rylenes, xanthenes, porphyrins, phthalocyanines, or other materials suited to a particular Stokes shift defined by an absorption range and an emission fluorescence. In some embodiments, the photoluminescent layer 50 may be of at least one inorganic luminescent material selected from the group of phosphors. The inorganic luminescent material may more particularly be from the group of Ce-doped garnets, such as YAG:Ce. As such, each of the photoluminescent portions may be selectively activated by a wide range of wavelengths received from the excitation emission 52 configured to excite one or more photoluminescent materials to emit an output emission having a desired color.

Still referring to FIG. 3, the illumination apparatus 10 may further include the coating 51 as at least one stability layer 58 configured to protect the photoluminescent material contained within the energy conversion layer 54 from photolytic and/or thermal degradation. The stability layer 58 may be configured as a separate layer optically coupled and adhered to the energy conversion layer 54. The stability layer 58 may also be integrated with the energy conversion layer 54. The photoluminescent layer 50 may also include the protective layer 36 optically coupled and adhered to the stability layer 58 or any layer or coating to protect the photoluminescent layer 50 from physical and chemical damage arising from environmental exposure.

The stability layer 58 and/or the protective layer 36 may be combined with the energy conversion layer 54 to form an integrated photoluminescent structure 60 through sequential coating, thermal-forming, or printing of each layer; or by sequential lamination or embossing. Additionally, several layers may be combined by sequential coating, lamination, or embossing to form a substructure. The substructure may then be laminated or embossed to form an integrated photoluminescent structure 60. Once formed, the photoluminescent structure 60 may be applied to a surface of at least one of the electrodes 26 and 28 such that the excitation emission 52 received from the LED sources 42 and converted to the output emission 22. Additional information regarding the construction of photoluminescent structures to be utilized in at least one photoluminescent portion of a vehicle is disclosed in U.S. Pat. No. 8,232,533 to Kingsley et al., entitled "PHOTOLYTICALLY AND ENVIRONMENTALLY STABLE MULTILAYER STRUCTURE FOR HIGH EFFICIENCY ELECTROMAGNETIC ENERGY CONVERSION AND SUSTAINED SECONDARY EMISSION," filed Jul. 31, 2012, the entire disclosure of which is incorporated herein by reference.

Figure 4A:
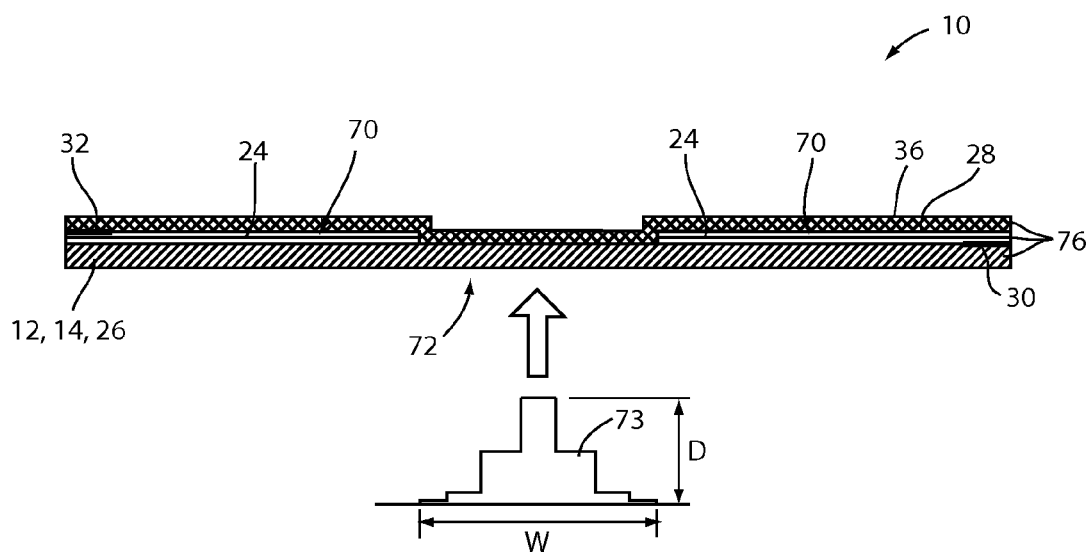
FIG. 4A is a schematic diagram of a method of manufacturing an illumination apparatus comprising a heat-dispersing electrode in a sealed assembly.

Referring now to FIGS. 2, 4A, 4B, and 4C, schematic diagrams of a method of manufacturing an illumination apparatus comprising the heat-dispersing electrode 12 in the sealed assembly 40 are shown. As illustrated in FIG. 4A, the method may begin by printing the light producing layer 24 on the heat-dispersing electrode 12. As previously discussed, the light producing layer may correspond to a plurality of layers that may be printed on the heat-dispersing electrode 12 in a plurality of steps. For example, the semiconductor ink 44 may be applied through various printing processes, including ink jet and silk screen processes to selected portion(s) of the heat-dispersing electrode 12. Additionally, the at least one dielectric layer 46 may be printed over the LED sources 42 to encapsulate and/or secure the LED sources 42 in position. In this way, the method provides for the light producing layer 24 to be applied to the heat-dispersing electrode 12 (e.g. the first electrode 26).

The method may continue by printing or otherwise affixing the top transparent conductor layer on the light producing layer 24 to form the second electrode 28. For example, the method may continue by printing a transparent conductor layer as a silver-containing or copper-containing epoxy, the method may provide for the first electrode 26 and the second electrode 28 to be in electrical connection with the bus bars 30 and 32. In this configuration, the controller 20 may supply current to the LED sources 42 via the bus bars 30 and 32. The light producing layer 24 may be printed to a region 70 configured to border a stamped portion 72 discussed further in reference to FIG. 4B.

A diagram of a stamp 73 configured to produce the stamped portion 72 is shown as a reference to demonstrate the method step of stamping the sealed assembly 40 of the illumination apparatus 10. The stamp 73 may have a depth D and a width W configured to produce the stamped portion 72. The depth D may be less than 2 mm and the width W may be less than 4 mm. The depth D may range from approximately 0.5 mm to 2 mm, and the width W may range from approximately 1 mm to 4 mm. As such, the stamp 73 may be configured to produce a corresponding dimension of depth and width as the stamped portion 72. In an exemplary embodiment, the illumination apparatus 10 may have a thickness T of less than 3 mm and in some embodiments a thickness T less than 2 mm.

Figure 4B:
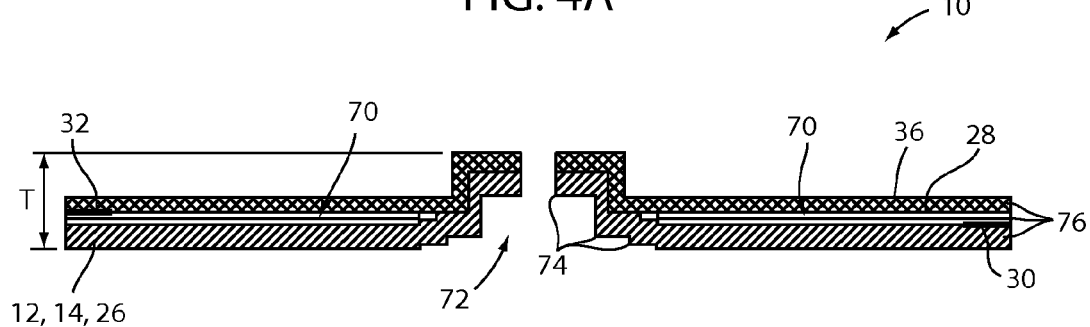
FIG. 4B is a schematic diagram of the method of manufacturing the illumination apparatus introduced in reference to FIG. 4A.

Referring now to FIGS. 4A and 4B, the method may continue by thermal-forming the first protective layer 36 to create a first seal configured to protect the light producing layer 24, the second electrode 28, the first bus bar, and the second bus bar 32 along the perimeter 34 of the illumination apparatus 10. Following the thermal-forming of the first protective layer 36, each of the first electrode 26, the light producing layer 24, the second electrode 28, and the first protective layer 36 may be stamped together forming a locking interconnection having a locking profile 37. In this configuration, each of the first electrode 26, the light producing layer 24, the second electrode 28, and the first protective layer 36 may be combined as integral layers of the illumination apparatus 10.

In an exemplary implementation, the locking profile 37 may comprise a plurality of intersecting angled portions 74 formed by segments 76 in the stamped portion 72. The intersecting angled portions 74 may serve to lock the first electrode 26 and the first protective layer 36 together with the light producing layer 24 and the second electrode 28 as a plurality of integral layers. In an exemplary embodiment, the intersecting angled portions 74 may correspond to a plurality of perpendicular intersections configured to retain the first protective layer 36 with the heat sink 16 (e.g. the first electrode 26). As demonstrated in FIG. 4B the illumination apparatus 10 may correspond to a stamped and integrated assembly comprising at least the first electrode 26, the light producing layer 24, the second electrode 28, and the first protective layer 36.

Figure 4C:
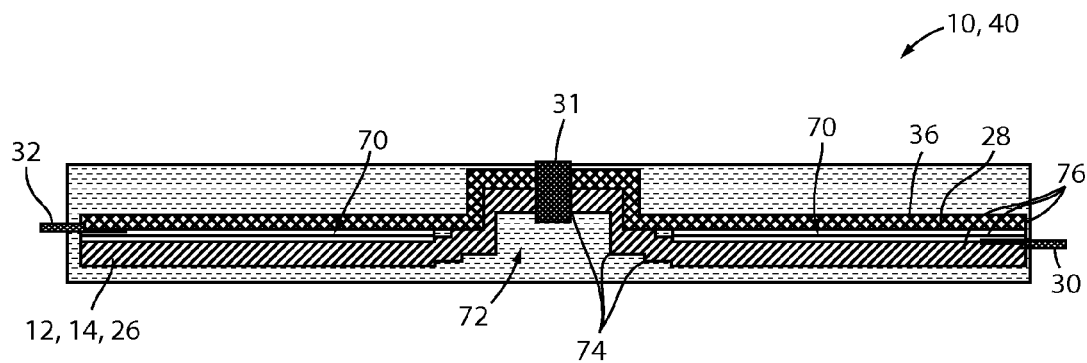
FIG. 4C is a schematic diagram of the method of manufacturing the lighting apparatus discussed in reference to FIGS. 4A and 4B.

Referring now to FIG. 4C, the method may continue by riveting or otherwise connecting the crimped connector 31 to the first electrode 26. The crimped connector 31 may correspond to a variety of connectors in configured to bind and secure the first electrode 26 to the first protective layer 36. In this configuration, the first electrode 26 may form a locking interconnection with the first protective layer 36 and the crimped connector 31.

The first bus bar 30 and the second bus bar 32 may be soldered or otherwise conductively connected to the first electrode 26 and the second electrode 28. As discussed previously, each of the bus bars 30 and 32 may be printed or otherwise conductively connected to the electrodes 26 and 28 such the current may flow uniformly from the first bus bar 30 and through first electrode 26. From the first electrode 26, the current may be conducted into the light producing layer 24 and into the second electrode 28. From the second electrode, the current passes outward through the second bus bar 32 of the illumination apparatus 10. In this configuration, the illumination apparatus 10 may be connected to a power supply via the controller 20 to selectively activate the light producing layer 24 to emit the output emission 22.

Finally, the method may continue by applying the second protective layer 38. The second protective layer 38 may correspond to an over-molded polymeric material configured to substantially seal the illumination apparatus 10 forming the enclosed or sealed assembly 40. The second protective layer 38 may correspond to a substantially light transmissive or transparent polymeric material molded over the illumination apparatus. The transparent polymeric material may correspond to a thermally conductive polymer, such as a thermally conductive injection molding grade thermoplastic. In this configuration, the light producing layer 24 is protected in a sealed configuration and the heat-dispersing electrode 12 may provide for the LED light sources of the light producing layer 24 to disperse heat for efficient operation when implemented in the sealed assembly.

Figure 5:
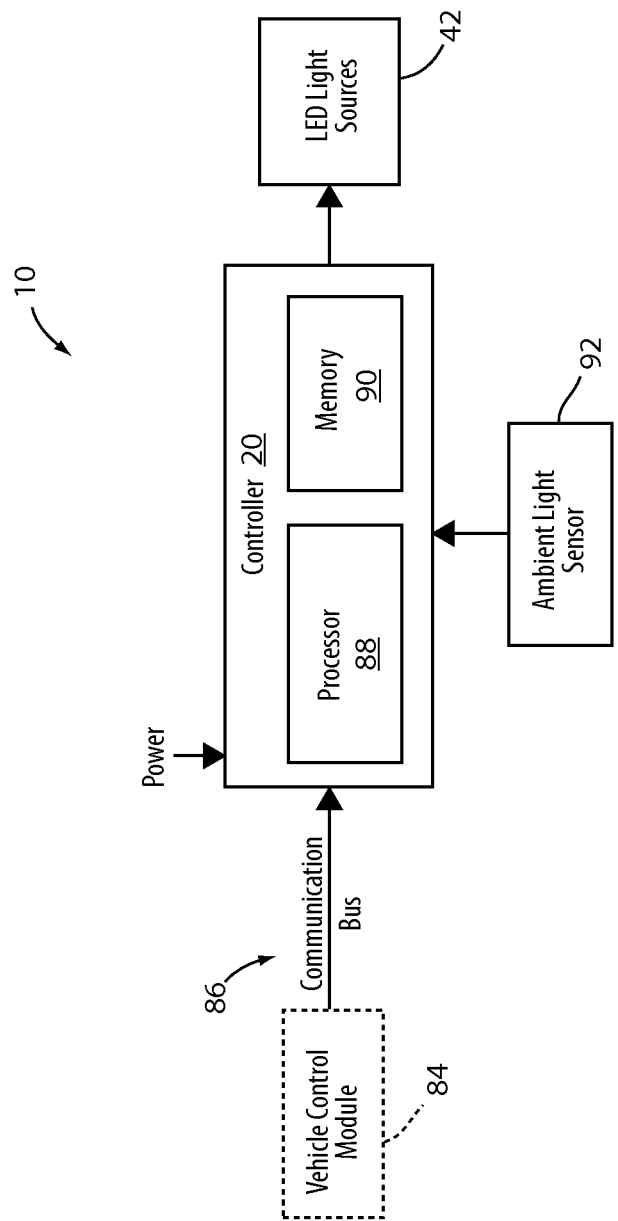
FIG. 5 is a block diagram of an illumination apparatus in accordance with the disclosure.

Referring to FIG. 5, a block diagram corresponding to the illumination apparatus 10 is shown. The controller 20 is in communication with the illumination apparatus 10 via the electrical supply busses discussed herein. The controller 20 may be in communication with the vehicle control module 84 via a communication bus 86 of the vehicle. The communication bus 86 may be configured to deliver signals to the controller 20 identifying various vehicle states. For example, the communication bus 86 may be configured to communicate to the controller 20 a drive selection of the vehicle, an ignition state, a door open or ajar status, a remote activation of the illumination apparatus 10, or any other information or control signals that may be utilized to activate or adjust the output emission 22. Though the controller 20 is discussed herein, in some embodiments, the illumination apparatus 10 may be activated in response to an electrical or electro-mechanical switch in response to a position of a closure (e.g. a door, hood, truck lid, etc.) of the vehicle.

The controller 20 may comprise a processor 88 comprising one or more circuits configured to receive the signals from the communication bus 86 and output signals to control the illumination apparatus 10 to control the output emission 22. The processor 88 may be in communication with a memory 90 configured to store instructions to control the activation of the illumination apparatus 10. The controller 20 may further be in communication with an ambient light sensor 92. The ambient light sensor 92 may be operable to communicate a light condition, for example a level brightness or intensity of the ambient light proximate the vehicle. In response to the level of the ambient light, the controller 20 may be configured to adjust a light intensity output from the illumination apparatus 10. The intensity of the light output from the illumination apparatus 10 may be adjusted by the controller 20 by controlling a duty cycle, current, or voltage supplied to the illumination apparatus 10.

For the purposes of describing and defining the present teachings, it is noted that the terms "substantially" and "approximately" are utilized herein to represent the inherent degree of uncertainty that may be attributed to any quantitative comparison, value, measurement, or other representation. The term "substantially" and "approximately" are also utilized herein to represent the degree by which a quantitative representation may vary from a stated reference without resulting in a change in the basic function of the subject matter at issue.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A light emitting assembly comprising:
    a heat sink of an electrically conductive material and configured to function as a first electrode;
    at least one protective layer formed to the assembly;
    a plurality of LEDs in a semiconductor ink disposed on the first electrode and operable to emit an excitation emission;
    a second electrode in communication with the plurality of LEDs; and at least one photoluminescent layer proximate at least one of the electrodes configured to convert the excitation emission to an output emission, wherein the heat sink and the protective layer are stamped together forming a locking interconnection.

2. The light emitting assembly according to claim 1, wherein the at lease one protective layer comprises a first protective layer disposed on an outward directed surface of the second electrode.

3. The light emitting assembly according to claim 2, wherein the first protective layer is thermal formed to the second electrode.

4. The light emitting assembly according to claim 2, wherein the at least one protective layer further comprises a second protective layer disposed substantially around the heat sink and the first protective layer configured to seal the light emitting assembly.

5. The light emitting assembly according to claim 1, wherein the heat sink has a thickness ranging of approximately 0.02 mm to 0.5 mm.

6. The light emitting assembly according to claim 1, wherein the electrically conductive material of the heat sink corresponds to aluminum alloy forming a base portion on which the plurality of LEDs are printed.

7. The light emitting assembly according to claim 1, wherein the locking interconnection corresponds to a locking profile comprising a plurality of angled portions of the first protective layer and the heat sink.

8. The light emitting assembly according to claim 7, wherein the plurality of angled portions correspond to a plurality of segments of the first protective layer and the heat sink.

9. The light emitting assembly according to claim 8, wherein the plurality of segments form a plurality of perpendicular intersections configured to retain the first protective layer with the heat sink.

10. The light emitting assembly according to claim 9, wherein the locking interconnection corresponds to a riveted connection configured to bind the locking interconnection.

11. A light emitting assembly comprising:
a heat sink of an electrically conductive material forming a first electrode;
a plurality of LEDs in a semiconductor ink disposed on the first electrode;
a second electrode in communication with the plurality of LEDs; and
a protection layer disposed on at lease one of the first electrode and the second electrode, wherein the heat sink and the at least one protective layer are stamped together forming a locking interconnection.

12. The assembly according to claim 11, further comprising a first bus bar extending along at least a portion of a perimeter of the light emitting assembly and in conductive connection with the first electrode.

13. The assembly according to claim 12, further comprising a second bus bar extending along at least a portion of the perimeter of the light emitting assembly and in conductive connection with the second electrode.

14. The assembly according to claim 13, wherein electrical current is supplied to the plurality of LEDs via the first bus bar such that the current flows substantially uniformly from the first bus bar to the second bus bar.

15. A method of manufacturing a lighting apparatus for a vehicle comprising the steps of:
printing a light producing layer in a semi-conductor ink on a first electrode configured to disperse heat energy;
printing a top transparent conductor layer on the light producing layer to form a second electrode;
thermal-forming the first protective layer to create a first seal configured to protect the light producing layer to form a first sealed assembly, the first sealed assembly comprising the first electrode, the light producing layer, and the second electrode; and
stamping the first sealed assembly to form a locking interconnection in a stamped portion between the first electrode and the first seal.

16. The method according to claim 15, wherein stamping the first sealed assembly forms a plurality of intersecting angled portions between the first electrode and the first seal.

17. The method according to claim 15, wherein the stamped portion is located centrally in the lighting apparatus.

18. The method according to claim 15, further comprising conductively connecting a first bus bar to the first electrode extending proximate a perimeter of the lighting apparatus.

19. The method according to claim 18, further comprising conductively connecting a second bus bar to the second electrode extending proximate the perimeter of the lighting apparatus.

* * * * *